United States Patent
Kawakami et al.

(10) Patent No.: US 6,496,162 B2
(45) Date of Patent: *Dec. 17, 2002

(54) LIGHT EMITTING DIODE DISPLAY UNIT

(75) Inventors: Shingo Kawakami, Tokyo (JP); Junichi Mizutani, Aichi-ken (JP); Hideki Mori, Aichi-ken (JP)

(73) Assignees: Koha Co., Ltd., Tokyo (JP); Toyoda Gose Co., Ltd., Aichiken (JP)

(*) Notice: Subject to any disclaimer, the term of this patent is extended or adjusted under 35 U.S.C. 154(b) by 0 days.

This patent is subject to a terminal disclaimer.

(21) Appl. No.: 09/754,586

(22) Filed: Jan. 4, 2001

(65) Prior Publication Data

US 2001/0001241 A1 May 17, 2001

Related U.S. Application Data

(62) Division of application No. 09/080,525, filed on May 18, 1998.

(30) Foreign Application Priority Data

May 19, 1997 (JP) .............................................. 9-128531

(51) Int. Cl.[7] ................................................. G09G 3/32
(52) U.S. Cl. .............................. 345/46; 345/39; 345/32; 345/83; 345/84
(58) Field of Search ............................... 345/39, 46, 82, 345/83, 84

(56) References Cited

U.S. PATENT DOCUMENTS

| | | | | | |
|---|---|---|---|---|---|
| 4,271,408 | A | * | 6/1981 | Teshima et al. | 345/83 |
| 4,628,422 | A | * | 12/1986 | Ewald | 362/240 |
| 5,140,220 | A | * | 8/1992 | Hasegawa | 313/116 |
| 5,144,288 | A | * | 9/1992 | Hamada et al. | 349/109 |
| 5,583,351 | A | * | 12/1996 | Brown et al. | 257/184 |
| 5,812,105 | A | * | 9/1998 | Ven | 345/83 |
| 5,894,196 | A | * | 4/1999 | McDermott | 313/110 |
| 6,177,761 | B1 | * | 1/2001 | Pelka et al. | 313/110 |
| 6,236,382 | B1 | * | 5/2001 | Kawakami et al. | 345/83 |

* cited by examiner

Primary Examiner—Bipin Shalwala
Assistant Examiner—Vincent E. Kovalick
(74) Attorney, Agent, or Firm—Katten Muchin Zavis Rosenman

(57) ABSTRACT

An LED display unit disclosed. A plurality of pixels are provided on an insulation substrate. Each pixel comprises vertically arranged green, red, and blue LEDs, wherein the green LED is above the red LED, and the blue LED is below the red LED. Each pixel is positioned in a corresponding one of cavities defined in a predetermined pattern on the insulation substrate, and each cavity provides a light reflection surface on the inner wall.

5 Claims, 6 Drawing Sheets

LIGHT EMITTING DIODE DISPLAY UNIT

This is a division of application Ser. No. 09/080,525, filed May 18, 1998.

BACKGROUND OF THE INVENTION

1. Field of the Invention

The present invention relates to a full-color type light emitting diode display unit (hereinafter referred to simply as an "LED unit"), and more particularly to an LED display unit which is expanded in light distribution angle, and is increased in luminance while improving Quality of mixed colors and white balance.

2. Description of the Related Art

As a result of successful production of high luminance blue LEDs, it becomes possible to manufacture a full-color display unit wherein three primary colors of blue, red, and green are used. A large-sized display wherein such LED display units are used has been manufactured, and such a large-sized display is fixed to, for example, the wall of a building or the like, so that it attracts walkers' eyes. Meanwhile, high luminance of green LEDs has been also realized recently, whereby full-color display units became possible to be fabricated by the use of the same number of LEDs as those of red and blue LEDs. In this connection, a larger number of green LEDs have been heretofore used than those of red and blue LEDs.

LED display unit is classified generally into the following two types.

(1) Large-sized Display

One dot is formed by utilizing a plurality of cannon ball-shaped LED lamps each having different luminescent colors, one module to display one Chinese character is composed by horizontally and vertically arranging 16×16 lamps (=256 dots), and a plurality of the modules are horizontally and vertically arranged. The resulting large-sized display is principally employed for display of information on the wall of a building or along an express-highway.

(2) Small- to Medium-sized Display

One dot of a cannon ball-shaped LED lamp is formed by employing a plurality of LED chips each having different luminescent color, one module is composed by horizontally and vertically arranging 16×16 lamps (=256 dots), and a plurality of the modules are horizontally and vertically arranged. The small- to medium-sized display is principally employed for display of information on schedules in a train station yard.

In such a full-color type LED display unit as described above, a plurality of LED chips or a plurality of LED lamps each having different luminescent color are used for pixels, so that the following characteristics are required.

(1) Excellent quality of mixed colors
(2) Excellent white balance
(3) Wide light distribution angle
(4) High luminance FIGS. 1A and 1B show a cannon ball-shaped LED wherein a plurality of the LED chips are used. The LED lamp 4 is one employed principally for a small-to medium-sized display, and made from a resin which is added with a light diffusing material. The LED lamp 4 comprises a lens 40 for sealing three LED chips 20G (green), 20R (red), and 20B (blue); and leads 41 for connecting the LED chips 20G, 20R, and 20B to wiring patterns of a printed-circuit board.

FIG. 2 shows an LED display unit in which the LED lamps 4 are used to be arranged in matrix. The LED display unit is constituted by horizontally and vertically arranging 16×16 LED lamps 4 (=256 dots) on a printed-circuit board 10. In this LED display unit, for preventing short circuit of wiring patterns on the printed-circuit board caused by close arrangement of leads of the LED lamps 4 on the printed-circuit board, the LED chips 20G, 20R, and 20B are obliquely arranged to widen the interval of the leads 41 of the LED lamp FIG. 3 is a graphical representation showing results obtained by measuring light distribution angle of the LED display unit in the A—A direction in FIG. 2, wherein the abscissa indicates the light distribution angle, and the ordinate indicates relative luminance based on the maximum luminance of 1. As is apparent from the figure, all the three colors have a relative luminance of ½ or more in the region "a", and at least one of the colors has a relative luminance of ½ or more in the regions "b1" and "b2". On the other hand, all the three colors have a relative luminance of ⅒ or more in the region "c". From the above results, the contents displayed on the LED display unit can be viewed in the range "c" of approximate 90°.

In the conventional LED display unit, howevers, there arises color collapse, and particularly, luminance of green is low in the region "b1", while it is high in the region "b2", so that sufficient white balance cannot be obtained, since three colors of LED chips have been obliquely arranged. Furthermore, although red color is hard to mix with either blue color or green color, the relative luminance of both blue and green is positioned on the upper and lower sides of the relative luminance of red color in the regions "b1" and "b2", so that good quality of mixed colors cannot be obtained.

SUMMARY OF THE INVENTION

Accordingly, an object of the present invention is to provide an LED display unit which is expanded in light distribution angle, and is increased in luminance while improving quality of mixed colors and white balance.

According to the first aspect of the invention, an LED display unit comprises: a plurality of light emitting diode (LED) pixels arranged in a predetermined pattern to display a predetermined image;

each of the plurality of LED pixels, comprising: a green LED, a red LED, and a blue LED vertically arranged in a row, such that the green LED is above the red LED, and the blue LED is below the red LED.

According to the second aspect of the invention, an LED display unit, comprises: an insulation substrate provided with a plurality of cavities defined in a predetermined pattern on one surface thereof, a reflection surface being formed on an inner wall in each of the plurality of cavities: and a plurality of light emitting diode (LED) pixels positioned in the plurality of cavities to display a predetermined image;

each of the plurality of LED pixels, comprising: a green LED, a red LED, and a blue LED vertically arranged in a row, such that the green LED is above the red LED, and the blue LED is below the red LED.

BRIEF DESCRIPTION OF THE DRAWINGS

The present invention will become more fully understood from the detailed description given hereinafter and the accompanying drawings which are given by way of illustration only, and thus are not limitative of the present invention, and wherein.

DETAILED DESCRIPTION OF THE REFERRED EMBODIMENTS

The LED display unit according to the present invention will be described in detail hereinafter by referring to the accompanying drawings.

Figure 1A:
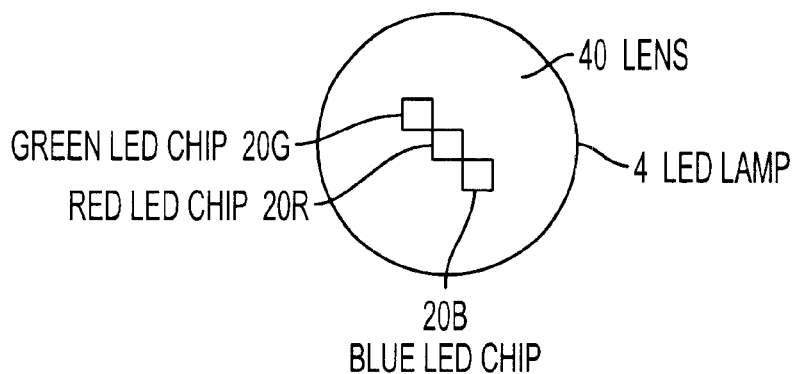
FIG. 1A is a plan view showing a conventional LED lamp.
Figure 1B:
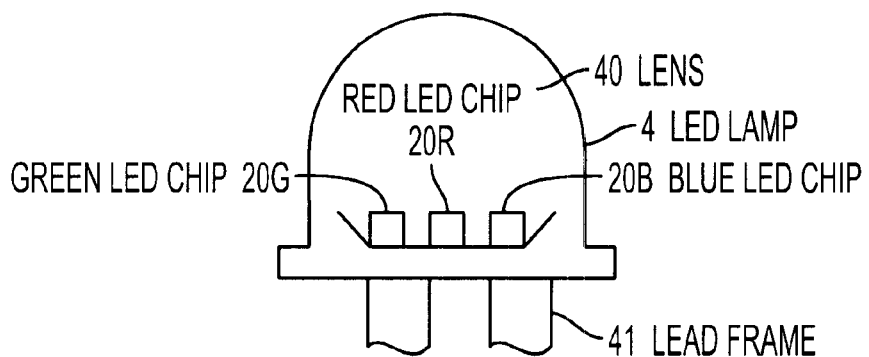
FIG. 1B is a side view showing the conventional LED lamp of FIG. 1A.
Figure 2:
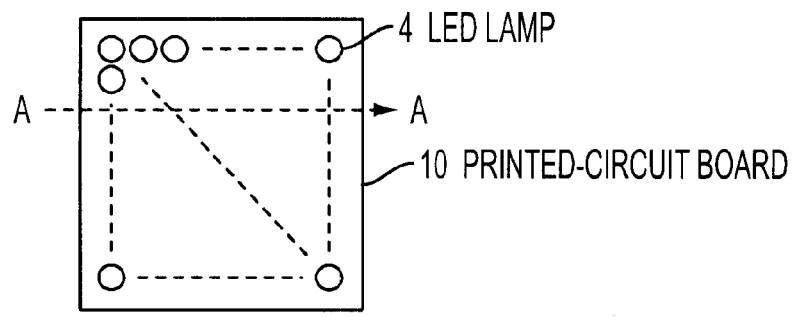
FIG. 2 is a plan view showing a conventional LED display unit.
Figure 3:
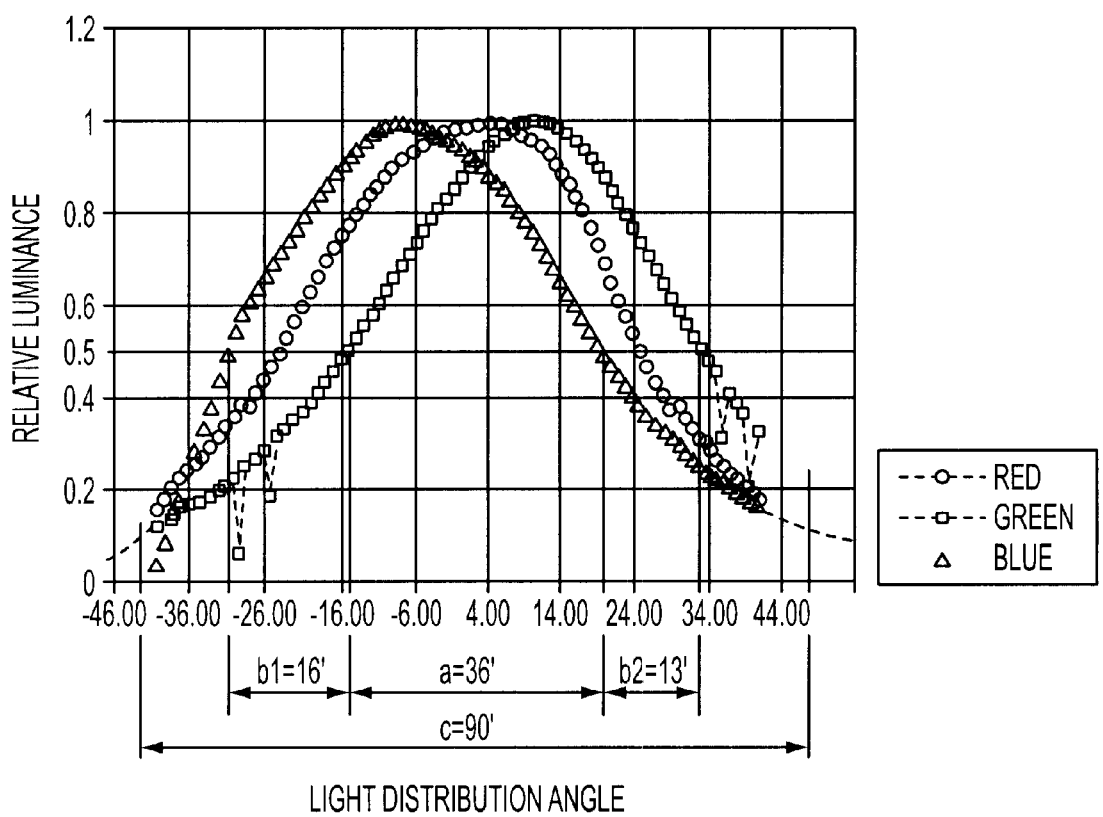
FIG. 3 is a graphical representation showing light distribution angle in the conventional LED display unit.
Figure 4A:
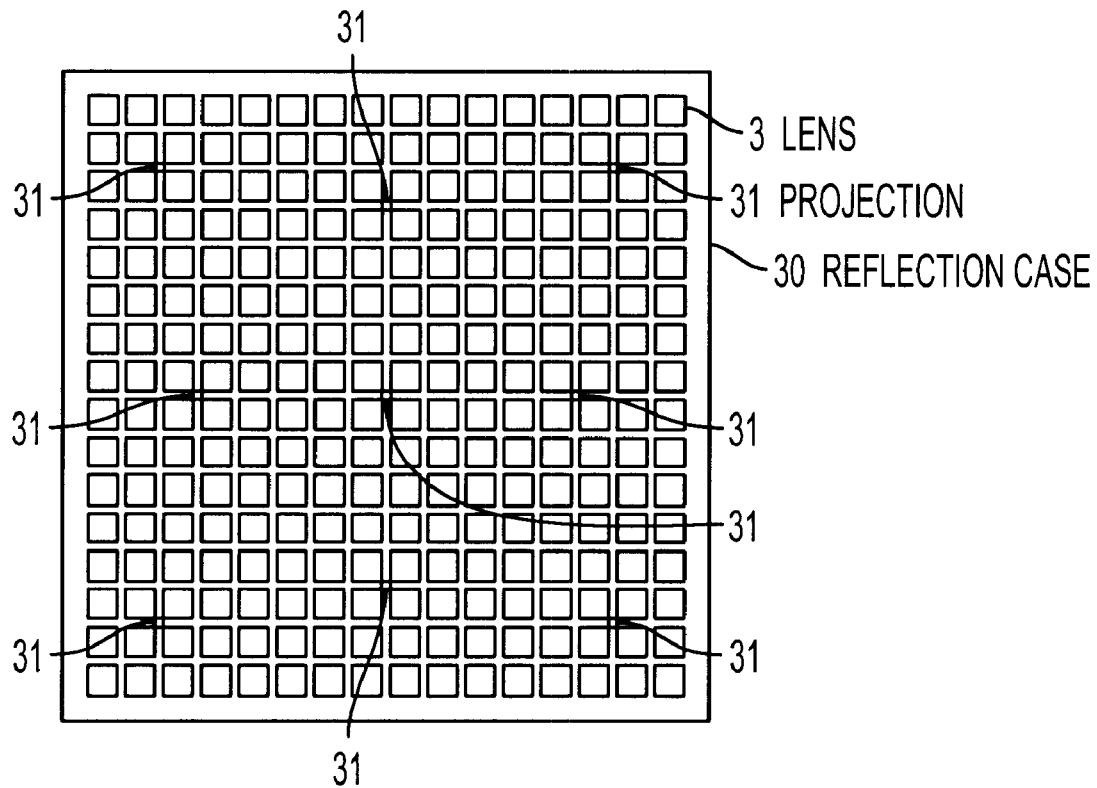
FIG. 4A is a plan view showing an LED display unit of a first preferred embodiment according to the present invention.
Figure 4B:
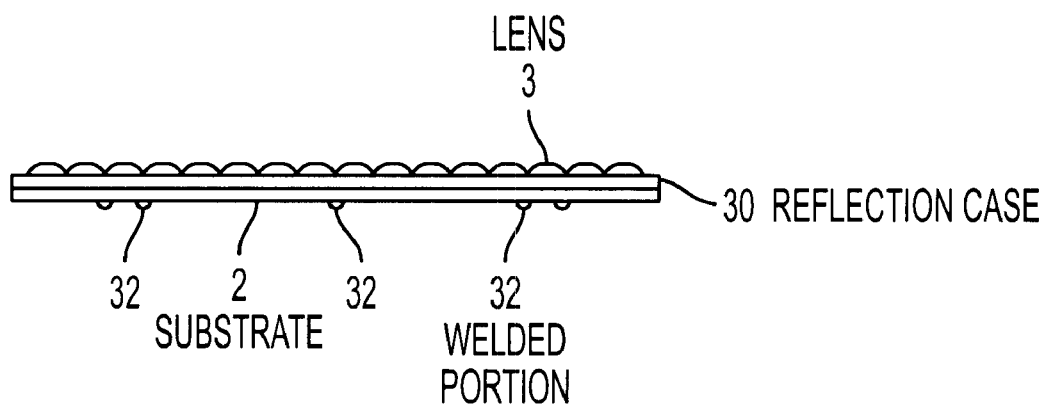
FIG. 4B is a side view showing the LED display unit of the first preferred embodiment of FIG. 4A.

FIGS. 4A and 4B illustrate an LED display unit of a first preferred embodiment of the present invention, respectively. The LED display unit comprises a substrate 2 having 256 (16×16) light emitting pixels (not shown) obtained by horizontally arranging 16 light emitting pixels and vertically arranging 16 light emitting pixels, respectively, to extend over the whole surface thereof, wherein one pixel is formed by vertically arranging a green LED, a red LED, and a blue LED: and a reflection case 30 of a resin to be provided with 256 lenses 3 of a resin which are disposed on the overall surface of the substrate 2, wherein 16 lenses are arranged in horizontal and vertical directions to cover the above described light emitting pixels, respectively.

While the reflection case 30 will be described later in conjunction with FIGS. 6A and 6C, it has such structure that lenses 3 are disposed to provide the 256 pixels, and nine projections 31 protrude on the opposite surface to be inserted into through-holes (not shown) defined at the corresponding positions on the substrate 2, whereby the extreme ends of the projections 31 protrude over the other surface to be thermally fused to form welded portions 32, thereby securing the same to the substrate 2.

Figure 5A:
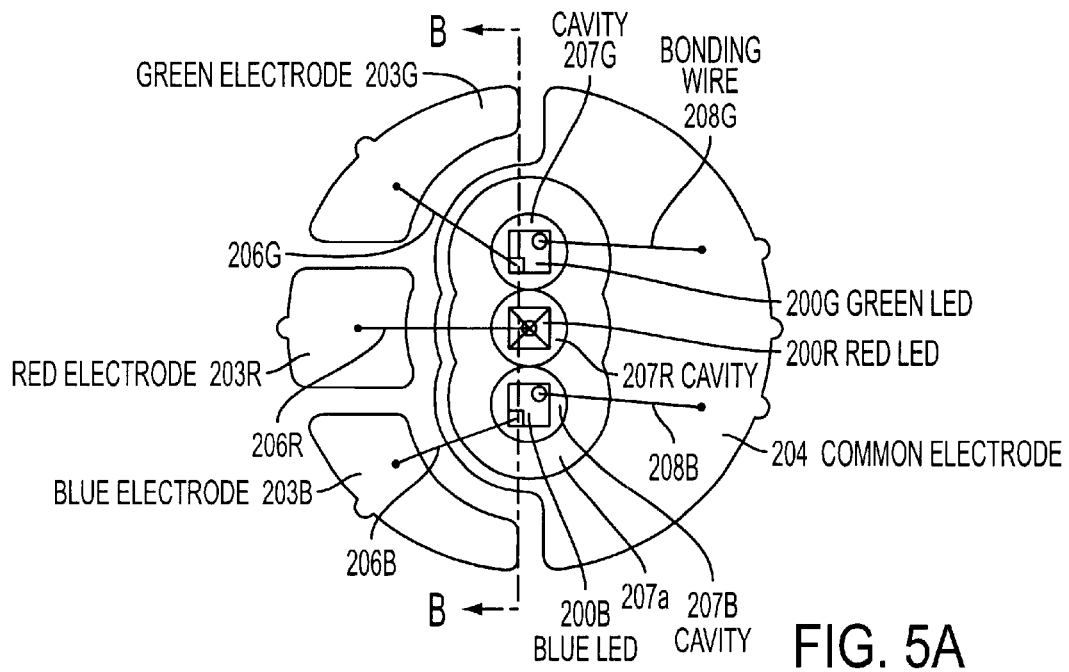
FIG. 5A is a plan view showing a pixel of the LED display unit of the first preferred embodiment according to the present invention.

FIG. 5A shows one of the light emitting pixels on the substrate 2 which comprises three LEDs, i.e., 200G (green), 200R (red), and 200B (blue) to be vertically arranged along a straight line and mounted to the bottom surfaces of three cavities 207G (green), 207R (red), and 200B (blue) defined on the substrate 2 in the vertical direction, respectively. The LED 200G is manufactured from a semiconductor of nitride-base group III (3)–V(5) compounds wherein a first electrode formed on the upper surface of the LED 200G is connected to a green electrode pattern 203G through a bonding wire 206G. Likewise, a second electrode formed on the upper surface of the LED 200G is connected to a common electrode pattern 204 through a bonding wire 208G. For the LED 200R, a first electrode formed on the upper surface is connected to a red electrode pattern 203R through a bonding wire 206R. The LED 200B is manufactured from a semiconductor of nitride-base group III (3)–V(5) compounds wherein a first electrode formed on the upper surface of the LED 200B is connected to a blue electrode pattern 203B through a bonding wire 206B. Likewise, a second electrode formed on the upper surface of the LED 200B is connected to the common electrode pattern 204 through a bonding wire 208B. The three cavities 207G, 207R, and 207B are enclosed by a common reflection wall 207a.

Figure 5B:
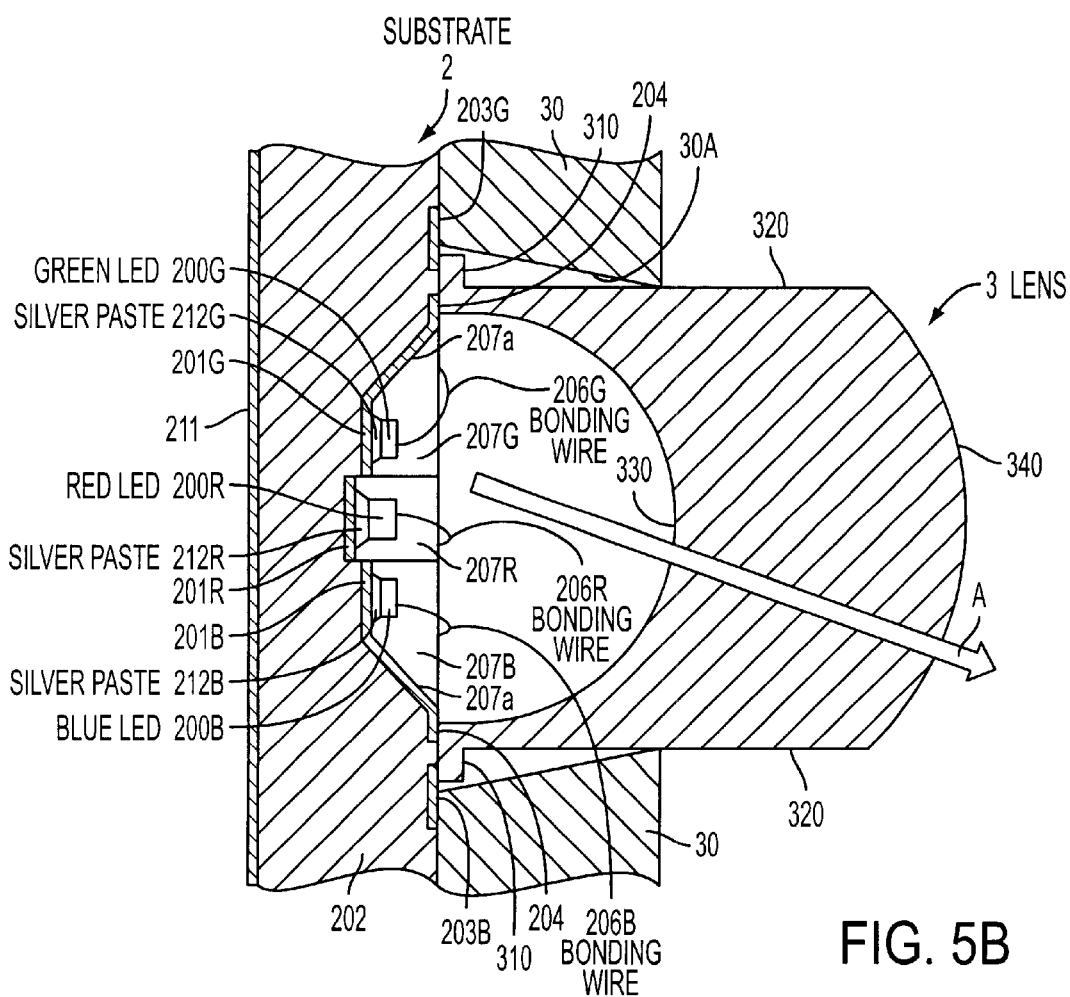
FIG. 5B is a sectional view taken along the line B—B of FIG. 5A.

FIG. 5B is a sectional view taken along the line B—B of FIG. 5A wherein the corresponding parts are designated by the same reference numerals, respectively, so that a repeated explanation is omitted, and the parts which have not yet been described in FIG. 5A will be explained hereinafter. The above-mentioned substrate 2 contains a base material layer 202 composed of a nonwoven glass fiber impregnated with epoxy resin. The cavities 207G, 207R, and 207B which are enclosed by the reflection wall 207 a are defined to be coated with a metal layer on the base material layer 202, respectively, and the green electrode pattern 203G, the red electrode pattern 203R the blue electrode pattern 203B, and the common electrode pattern 204 are formed on the upper surface of the base material layer, while a predetermined wiring pattern 211 is formed on the other side of the base material layer. Since the red LED 200R has a greater height than those of the other LEDs 200G and 200B, the cavity 207R has a greater depth than those of the other cavities 207G and 207B, so that each top of these LEDs is held at the same level. Insulating bottom surfaces of the LEDs 200G and 200B as well as a lower electrode of the LED 200R are secured to the metal layers 201G and 201B as well as the electrode pattern 201R with silver (electrically conductive) paste 212G, 212R, and 212B on the bottom surfaces of the cavities 207G, 207R, 207B, respectively. The LEDs 200G, 200R, and 200B are covered with the lenses 3 engaged with the reflection case 30. While the lens 3 will be described in detail hereunder, it is composed of an engaging part 310, a flat part 320, a hemispherical part 330, and a curved part 340, and when the engaging part 310 is forcibly fitted together with the flat portion 320 into a tapered opening 30A defined in the reflection case 30, the lens 3 is engaged with the reflection case 30.

Figure 6A:
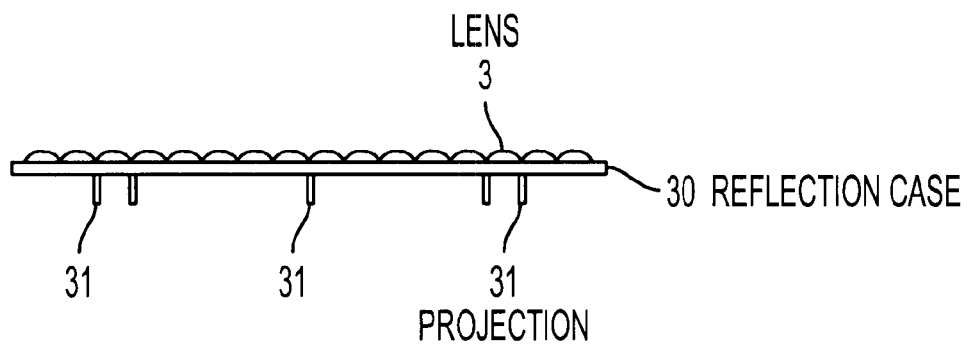
FIG. 6A is a side view showing a reflection case of the LED display unit of the first preferred embodiment according to the invention.

FIG. 6A shows a side section of the above-mentioned reflection case 30 wherein it is made from ABS resin or the like, and with which 256 lenses 3 are provided on the reflection case 30 so as to protrude from one side thereof, and nine projections 31 projecting towards the opposite side of the lenses 3 are formed at predetermined positions, respectively.

Figure 6B:
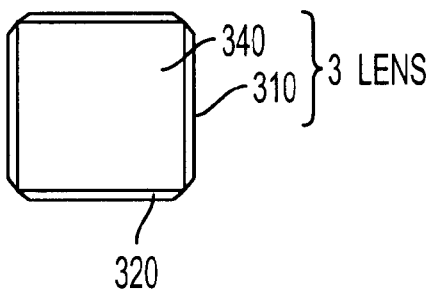
FIG. 6B is a plan view showing a lens of the reflection case of FIG. 6A.
Figure 6C:
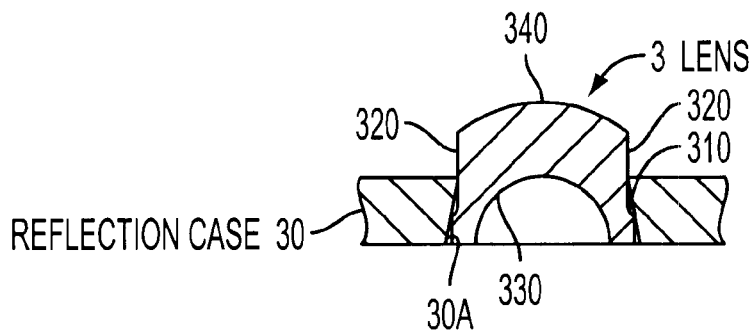
FIG. 6C is a sectional view showing the lens of FIG. 6B.

Each of FIGS. 6B and 6C shows one of the lenses 3 wherein it is made from acrylic resin or the like to which a light diffusion material has been added, and the lens 3 is composed of four flat planes 320 constituting a square pole extending along the direction of optical axis; a hemispherical part 330 of a light input plane functioning also to provide a substantially hemispherical space inside the lens; a curved surface part 340 of a light output plane; and an engagement part 310 being formed by expanding the outer figure of the flat planes 320 and functioning to be fitted forcibly into the opening 30A of the reflection case 30. While an inorganic material such as silica is typically used as the light diffusion material, it is not limited thereto, but an organic material may be used.

Figure 7:
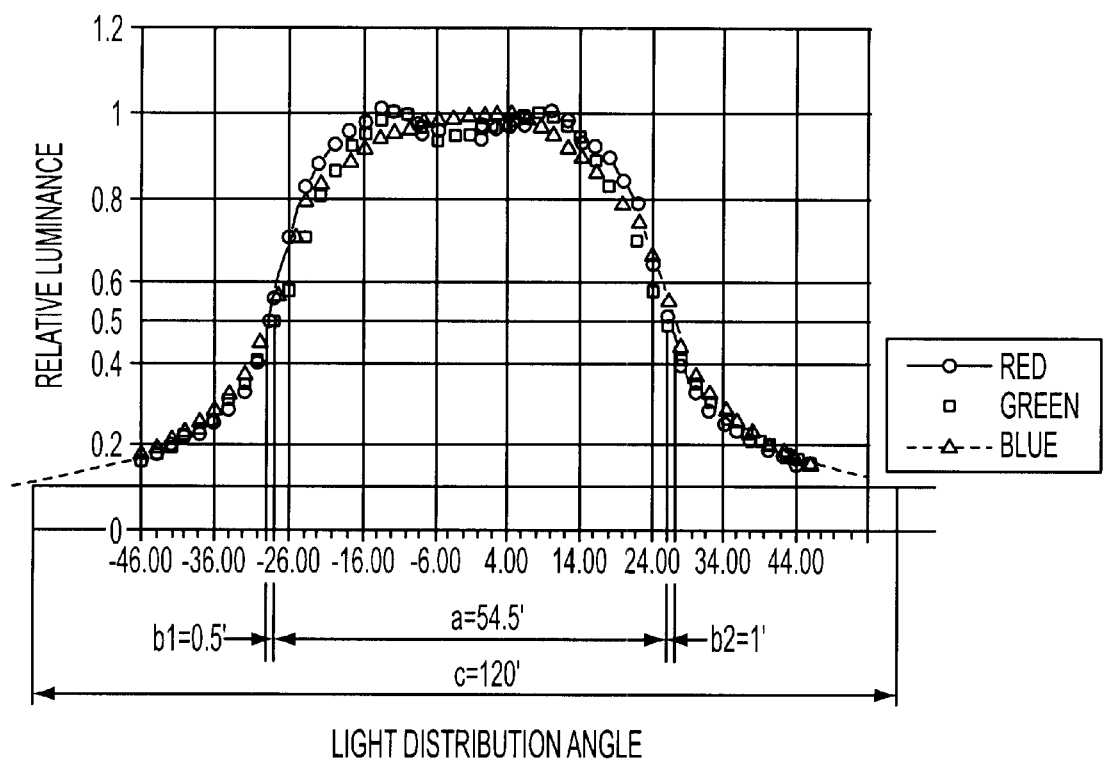
FIG. 7 is a graphical representation showing light distribution angle of the LED display unit of the first preferred embodiment according to the invention.

FIG. 7 is a graphical representation illustrating the light distribution angle in a horizontal direction of the LED display unit of the first preferred embodiment. As is seen from FIG. 7, the regions "b1" and "b2" in which color collapse arises may be substantially ignored, and further, a range in which the displayed content can be seen extends to 120° (C=120°).

Returning to the explanation of FIG. 5B, since the LED 200G is positioned at above the LEDs 200R and 200B, the vertical light orientation of the LED 200G may be directed downwards as shown by the arrow A. Since an LED display unit is usually mounted above visual point, decrease in luminance of the LED 200G can be suppressed by the light orientation. As a result, excellent white balance can be obtained in the present preferred embodiment.

Returning again to the explanation of FIGS. 5A and 5B, an area of the reflection walls which is utilized by the LEDs 200G and 200B is larger than that utilized by the LED 200R, so that green and blue output lights having sufficient luminance can be obtained.

Moreover, since both the LEDs 200G and 200B are adjacent to the LED 200R, improvement for quality of mixed colors can be expected in cooperation with the effect for preventing decrease in luminance of the LEDs 200G and 200B. Furthermore, since the LEDs 200G and 200B have been manufactured from a semiconductor of nitride-base group III (3)–V(5) compounds, they may be fabricated in the form of one chip.

While the LED display unit according to the present invention has been fully described in the above described preferred embodiment, for instance, the following modifications may be applied.

(1) Although the lens of a resin containing a light diffusion material has been employed, a transparent lens maybe utilized in the case when luminance is required to be increased in accordance with a predetermined light distribution angle.

(2) In increasing contrast between turned-on and-off LEDs, a black or the like dye may be added to a resin of the lens.

(3) While LEDs have been arranged vertically in the order of green, red, and blue in a row, they may be arranged in this order in two or three rows.

(4) Although the display unit in the preferred embodiment is suitably applied to a small- to medium-sized display, it may also be applied to a large-sized display.

(5) While a reflection wall has been defined by a cavity, such a reflection wall may be formed on the lower part of the inner wall surface of a lens without accompanying a cavity. When light-emitting luminance is sufficient, a reflection wall may be optionally omitted.

As described above, according to the LED display unit of the present invention, a green LED is located over a red LED, while a blue LED is positioned under the red LED along a vertical line in a row, so that it is possible to improve quality of mixed colors and white balance. Furthermore, since a reflection wall for reflecting output light is provided, and a green LED and a blue LED are prepared from a semiconductor of nitride-base group III (3)–V(5) compounds, luminance can be increased. Besides decrease in luminance of green and blue can be suppressed. Moreover, since light diffusing lenses have been used, light distribution angle can be expanded.

It will be appreciated by those of ordinary skill in the art that the present invention can be embodied in other specific forms without departing from the spirit or essential characteristics thereof.

The presently disclosed preferred embodiments are therefore considered in all respects to be illustrative and not restrictive. The scope of the invention is indicated by the appended claims rather than the foregoing description, and all changes that come within the meaning and range of equivalents thereof are intended to be embraced therein

What is claimed is:

1. A light emitting diode display unit, comprising:
an insulation substrate provided with a plurality of cavities defined in a predetermined pattern on one surface thereof, each of said plurality of surfaces comprising first, second and third cavities vertically arranged in a row and a common reflection wall enclosing said first to third cavities;
a plurality of green LEDs each mounted in said first cavity, each of said plurality of green LEDs having first and second electrodes on a top surface thereof;
a plurality of red LEDs each mounted in said second cavity, each of said plurality of red LEDs having a first electrode on a top surface thereof and a second electrode on a bottom surface thereof; and
a plurality of blue LEDs each mounted in said third cavity, each of said plurality of blue LEDs having first and second electrodes on a top surface thereof;
wherein said second cavity is deeper than said first and third cavities.

2. A light emitting diode display unit, comprising:
an insulation substrate provided with a plurality of cavities defined in a predetermined pattern on one surface thereof, each of said plurality of surfaces comprising first, second and third cavities arranged in a row and a common reflection wall enclosing said first to third cavities;
a plurality of green LEDs each mounted in said first cavity, each of said plurality of green LEDs having first and second electrodes on a top surface thereof;
a plurality of red LEDs each mounted in said second cavity, each of said plurality of red LEDs having a first electrodes on a top surface thereof and a second electrode on a bottom surface thereof; and
a plurality of blue LEDs each mounted in said third cavity, each of said plurality of blue LEDs having first and second electrodes on a top surface thereof wherein
said first electrodes of said plurality of green and blue LEDs are connected to common electrodes provided on said one surface of said insulation substrate;
said second electrodes of said plurality of green and blue LEDs are connected correspondingly to green and blue electrodes, respectively, provided on said one surface of said insulation substrate, and
said first electrodes of said plurality of red LEDs are connected to red electrodes provided on said one surface of said insulation substrate, while said second electrodes of said plurality of red LEDs are connected to bottom surfaces of said second cavities.

3. A light emitting diode display unit, comprising:
an insulation substrate provided with a plurality of cavities defined in a predetermined pattern on one surface thereof, a reflection surface being formed on an inner wall in each of said plurality of cavities; and
a plurality of light emitting diode (LED) pixels positioned in said plurality of cavities to display a predetermined image;

wherein each of said plurality of LED pixels including a green LED, a red LED, and a blue LED vertically arranged in a row, such that said red LED is between said green LED, and said blue LED, said green, red and blue LEDs associated with each of said plurality of LED pixels being positioned in one of the plurality of cavities; and wherein each of a first portion of the pixel reflection surface used by a green LED and a second portion of the pixel reflection surface used by a blue LED is larger than a third portion of the pixel reflection surface used by a red LED.

4. A light emitting diode display unit, comprising:

an insulation substrate provided with a plurality of cavities defined in a predetermined pattern on one surface thereof, each of said plurality of cavities comprising first, second and third cavities vertically arranged in a row and a common reflection wall enclosing said first to third cavities;

a plurality of green LEDs each mounted in said first cavity, each of said plurality of green LEDs having first and second electrodes on a top surface thereof;

a plurality of red LEDs each mounted in said second cavity, each of said plurality of red LEDs having a first electrode on a top surface thereof and a second electrode on a bottom surface thereof; and a plurality of blue LEDs each mounted in said third cavity, each of said plurality of blue LEDs having first and second electrodes on a top surface thereof wherein said second cavity is deeper than said first and third cavities; and wherein each of a first portion of the common reflection wall used by said plurality of green LEDs and a second portion of the common reflection wall used by said plurality of blue LEDs is larger than a third portion of the common reflection wall used by said plurality of red LEDs.

5. A light emitting diode display unit comprising:

a plurality of light emitting diode (LED) pixels arranged in a predetermined pattern to display a predetermined image;

each of said plurality of LED pixels including a green LED, a red LED, and a blue LED vertically arranged in a row, such that said red LED is between said green LED and said blue LED, said green, red and blue LEDs being positioned in a common cavity;

wherein said green LED, said red LED, and said blue LED are covered with a lens having a curved output plane and a substantially hemispherical input plane; and wherein the lens includes a reflective surface formed on an inner wall of the substantially hemispherical input plane.

* * * * *